(12) United States Patent
Deslandes

(10) Patent No.: US 9,817,060 B2
(45) Date of Patent: Nov. 14, 2017

(54) OPTIMIZED WAVELENGTH PHOTON EMISSION MICROSCOPE FOR VLSI DEVICES

(71) Applicant: FEI EFA, Inc., Fremont, CA (US)

(72) Inventor: Herve Deslandes, Saint Martin d'Uriage (FR)

(73) Assignee: FEI EFA, Inc., Fremont, CA (US)

( * ) Notice: Subject to any disclaimer, the term of this patent is extended or adjusted under 35 U.S.C. 154(b) by 579 days.

(21) Appl. No.: 14/250,361

(22) Filed: Apr. 10, 2014

(65) Prior Publication Data

US 2015/0091602 A1 Apr. 2, 2015

Related U.S. Application Data

(60) Provisional application No. 61/810,645, filed on Apr. 10, 2013.

(51) Int. Cl.
*G01R 31/26* (2014.01)
*G01R 31/311* (2006.01)
*G01R 15/24* (2006.01)

(52) U.S. Cl.
CPC ....... *G01R 31/2648* (2013.01); *G01R 15/246* (2013.01); *G01R 31/311* (2013.01)

(58) Field of Classification Search
CPC .......................... G01R 31/2813; G01R 15/246; G01R 31/311; G01R 31/28; G01R 15/02
USPC ..................................... 324/762.01
See application file for complete search history.

(56) References Cited

U.S. PATENT DOCUMENTS 5,166,755 A 11/1992 Gat
5,822,222 A * 10/1998 Kaplinsky ................. G01J 5/60
250/316.1
6,825,978 B2 * 11/2004 Khurana ............ G02B 21/0004
348/E5.09
7,157,706 B2 1/2007 Gat et al.
7,427,758 B2 9/2008 Garman et al.
7,466,343 B2 12/2008 Gat
(Continued)

FOREIGN PATENT DOCUMENTS

WO 2014/169154 A1 10/2014

OTHER PUBLICATIONS

Deslandes, H. et al., "Limitations to photon-emission microscopy when applied to 'hot' devices", Proc. ESREF 2003, Mic. Rel. 43, 2003, pp. 1645-1650.
(Continued)

*Primary Examiner* — Melissa Koval
*Assistant Examiner* — Courtney McDonnough
(74) *Attorney, Agent, or Firm* — Klarquist Sparkman, LLP

(57) ABSTRACT

A method for emission testing of a semiconductor device (DUT), by mounting the DUT onto an test bench of an emission tester, the emission tester having an optical detector; electrically connecting the DUT to an electrical tester; applying electrical test signals to the DUT while keeping test parameters constant; serially inserting one of a plurality of shortpass filters into an optical path of the emission tester and collecting emission test signal from the optical detector until all available shortpass filters have been inserted into the optical path; determining appropriate shortpass filter providing highest signal to noise ratio of the emission signal; inserting the appropriate shortpass filter into the optical path; and, performing emission testing on the DUT.

15 Claims, 2 Drawing Sheets

(56) References Cited

U.S. PATENT DOCUMENTS

| | | | |
|---|---|---|---|
| 7,659,981 | B2 | 2/2010 | Lo et al. |
| 7,816,650 | B2 | 10/2010 | Garman et al. |
| 8,071,947 | B2 | 12/2011 | Garman et al. |
| 8,164,813 | B1 | 4/2012 | Gat et al. |
| 8,466,964 | B2 | 6/2013 | Gat et al. |
| 8,497,479 | B1 | 7/2013 | Garman et al. |
| 2006/0103378 | A1* | 5/2006 | Pakdaman ............ G01R 31/311 324/228 |
| 2008/0170143 | A1 | 7/2008 | Yoshida |

OTHER PUBLICATIONS

Faggion, G. et al., "Effect of IC Geometry Shrink on Photon Emission Spectrum", LSI Testing Symposium, 2007, Japan, pp. 335-340.

Gat, N. et al., "Variable Cold Stop for Matching IR Cameras to Multiple f-number Optics", Society of Photo-Optical Instrumentation Engineers, SPIE Proceedings 6542, Infrared Technology and Applications, XXXIII, Defense & Security Symposium, Orlando, FL, 2007, pp. 1-10.

Kindereit, U., et al., "Near-Infrared Photon Emission Spectroscopy Trends in Scaled SOI Technologies", ISTFA 2012: Conference Proceedings from the 38th International Symposium for Testing and Failure Analysis, Nov. 11-15, 2012, Phoenix Convention Center, Phoenix, Arizona, USA, ASM International, 2012, p. 128 (7 pages).

Kindereit, U. et al., "Near-infrared photon emission spectroscopy of a 45 nm SOI ring oscillator", IRPS 2012: Reliability Physics Symposium, Apr. 15-19, 2012, Anaheim, California, USA, p. 2D.2.1-2D.2.7, 2012 IEEE International, 7 pages.

International Search Report and Written Opinion in International Patent Application No. PCT/US2014/033701, dated Aug. 22, 2014.

Opto-Knowledge Systems, Inc. (OSKI) VariAp Product Page, at http://www.techexpo.com/WWW/opto-knowledge/prod_variAp.html , accessed Apr. 13, 2015.

VariAp Systems by OSKI, Opto-Knowledge "Converting Light Into Knowledge Since 1991": Informational Brochure, 8 pages, accessed Apr. 13, 2015.

US Army SBIR Commercialization brochure, at http://www.techexpo.com/WWW/opto-knowledge/Commercialization_Army_book2005-a.pdf, accessed Apr. 13, 2015.

US Army SBIR Quality award, at http://www.techexpo.com/WWW/opto-knowledge/2006-Army-SBIR_Quality_Award-1.pdf, accessed Apr. 13, 2015.

\* cited by examiner

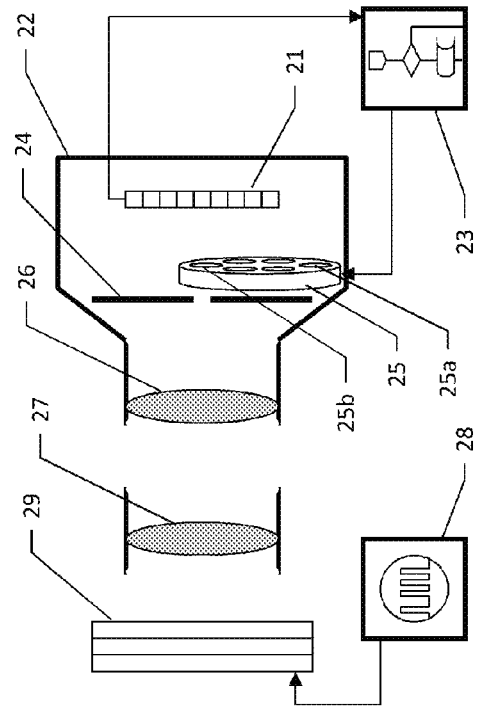
Figure 1
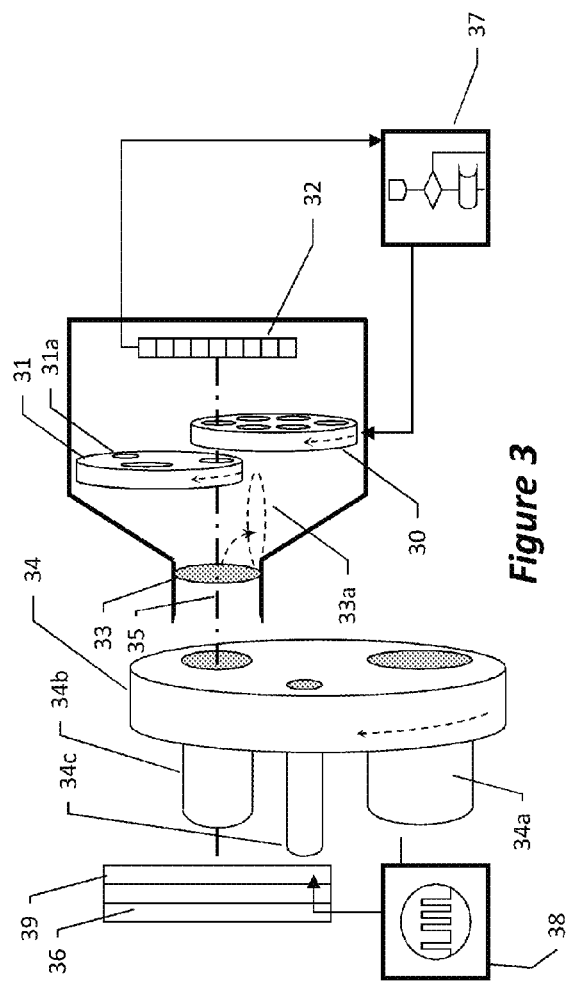
Figure 2
Figure 3

OPTIMIZED WAVELENGTH PHOTON EMISSION MICROSCOPE FOR VLSI DEVICES

RELATED APPLICATIONS

The present application claims priority benefit from U.S. Provisional Application Ser. No. 61/810,645, filed on Apr. 10, 2013, the disclosure of which is incorporated herein in its entirety.

GOVERNMENT LICENSE RIGHTS

This invention is based upon work supported by the Office of the Director of National Intelligence (ODNI), Intelligence Advanced Research Projects Activity (IARPA), via Air Force Research Laboratory (AFRL) contract number FA8650-11-C-7105. The ideas and conclusions contained herein are those of the inventors and should not be interpreted as necessarily having the official endorsements, either expressed or implied, of ODNI, IARPA, AFRL, or the U.S. Government.

FIELD

The present application belongs to the field of Photon Emission microscopy.

BACKGROUND

Backside Photon Emission Microscopy (PEM) is commonly used for circuit diagnostics and analyses of VLSI (Very-Large-Scale Integration) devices (chips). The premise of PEM is that individual logic gates within a VLSI circuit emit "Hot Carrier" (HC) photons when switching states. These photons are generally in the Infrared (IR) part of the spectrum, and since Silicon is transparent at these wavelengths, it is possible to observe the circuit (Device Under Test, or DUT) in action through its back side (the substrate side, opposite to the metal layer side)

Cameras (detector arrays) sensitive across the IR range are readily available, with frequency response shown in FIG. 1. Commonly, MCT cameras (Mercury Cadmium Telluride, HgCdTe) are used for this purpose since their response is uniform across a wide slice of the spectrum extending up to LWIR (about 18 um). Other types of detectors such as MOS CCD, Indium Antimonide (InSb) or Indium-Gallium-Arsenide (InGaAs) are also commonly used.

The spectral characteristic of the emissions from the semiconductor gates depends on many factors, such as excitation voltage, defect type and fabrication technology. A significant part of the emission lies in wavelengths beyond the traditional threshold of 1.55 um (commonly observed by InGaAs cameras operating at liquid Nitrogen temperature).

For common VLSI devices, however, the HC emissions are very faint, and since the amount of noise originating in thermal emissions (which follows the black body radiation spectral distribution) increases with wavelength, it interferes more with observations at these longer wavelengths.

In each band of the spectrum, therefore, are present both HC emissions from the DUT, which constitute the signal, and thermally-originated emissions, from both the DUT and the optics of the microscope, which contribute to the noise. Having a large signal-to-noise ratio (SNR) is important for achieving good observations.

The faint HC emissions also cause the exposure times to be as long as hundreds of seconds, which complicates the observation. One way to shorten such exposure times is to increase the SNR.

Some existing designs limit the range of observation to 1.5 um (which coincides with the sensitivity of InGaAs cameras) and since thermal noise is rather weak at these wavelengths, such a system works great for devices operating voltage above 800 mV.

For such wavelengths, passive designs are used to mitigate thermal noise that originates outside of the nominal optical path of the microscope, but they cannot completely eliminate it, nor can they eliminate thermal noise that originates within the optical path. In prior art systems, a relay lens is placed between the objective and the detector, and a cold aperture is placed between the relay lens and the detector in a position corresponding to the image location of the aperture of the objective, as imaged by the relay lens. This arrangement minimizes stray thermal radiation that is emitted by the body of the camera. For further information the reader is referred to, e.g., U.S. Pat. No. 6,825,978.

SUMMARY

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Described herein are aspects of a camera which adaptively selects an optimal wavelength for observation of a VLSI device, by inserting an appropriate filter in the optical path. The wavelength is optimized according to criteria such as maximizing the SNR, or a combination of high SNR and high resolution (which biases the optimization towards shorter wavelengths). The cameras may also have multiple swappable objective lenses and multiple cold apertures, and the position and size of the cold aperture has to be adjusted according to each objective lens. This can be achieved by having multiple apertures on a selector wheel.

While previous art already describes the introduction of a filter in the optical path, it does not do so in an adaptive manner and with consideration to maximizing SNR. Since the optical signal from the VLSI device is very faint, such filters traditionally have a wide bandwidth, in order to allow more light in, and thus shorten the required exposure times.

According to disclosed aspects, a set of short pass filters is used, and different shortpass filter is selected according to the type of device being investigated and the voltage applied to the device (A shortpass (SP) filter is an optical interference or colored glass filter that attenuates longer wavelengths and transmits (passes) shorter wavelengths over the active range of the target spectrum). In order to do that, however, the system first needs to characterize the SNR across the possible observation spectrum. The disclosed embodiments enable investigation of recent VLSI technology of devices that exhibit HC emissions in longer wavelengths, with a useful signal as high as 3 um.

Since the HC photon emissions depend both on inherent characteristics of the DUT and on operating parameters such as voltage and temperatures, the optimal filter selection vary from device to device, and so it may not be practical to pre-determine it.

According to one embodiment, an optical system for imaging a semiconductor device is provided, the system comprising: a bench for mounting the semiconductor device; an optical arrangement defining optical path; a detector sensitive to electromagnetic radiation having wavelengths of at least from 1000 nm to 2200 nm; a plurality of shortpass optical filters with high blocking capabilities beyond their cut-off wavelength; a selector for selectively placing one of said filters within said optical path; and, a controller connected to said detector and to said selector, the controller configured to selectively operate in a calibration mode and in a test mode, and wherein: during calibration mode the controller operates the selector to successively insert one of said filters within said optical path as the controller records emission signal received by the detector, and once all of said filters have been placed within said optical path the controller operates to compare the signal-to-noise ratio of the output of said detector for each of said filter; and, during test mode the controller operates said selector to insert one of the filter having the best signal-to-noise ratio for a selected test voltage, Vdd, into the optical path while the controller records emission signal received by the detector.

According to another embodiment, a method for emission testing of a semiconductor device (DUT) is provided, comprising the steps of: mounting the DUT onto an test bench of an emission tester, the emission tester having an optical detector; electrically connecting the DUT to an electrical tester; applying electrical test signals to the DUT while keeping test parameters constant; serially inserting one of a plurality of shortpass filters into an optical path of the emission tester and collecting emission test signal from the optical detector until all available shortpass filters have been inserted into the optical path; determining appropriate shortpass filter providing highest signal to noise ratio of the emission signal; inserting the appropriate shortpass filter into the optical path; and, performing emission testing on the DUT. The method may further include changing voltage Vdd and selecting a different shortpass filter and thereafter performing a second emission testing of the DUT.

According to further embodiment, a method for emission testing of a semiconductor device (DUT) is provided, comprising: providing an electrical tester capable of inducing state changes in gates of said DUT; providing an emission tester having an optical system to image emissions from the DUT onto a photodetector; providing a plurality of shortpass filters serially insertable into optical path of the optical system; stimulating the DUT using said electrical tester; serially collecting optical emissions from said DUT through each of the filters, while keeping all test parameters constant; measuring signal to noise ratio (SNR) of the optical emission collected through each filter; selecting one filter that maximizes the SNR; stimulating said DUT using the electrical tester; and collecting optical emissions from said DUT through the one filter.

DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 1: Response function of various camera sensor technologies.

FIG. 2: Camera with multiple filters and adaptive controller.

FIG. 3: Camera with multiple objectives, multiple shortpass filters, and multiple cold apertures, removable relay lens.

DETAILED DESCRIPTION

Figure 5:
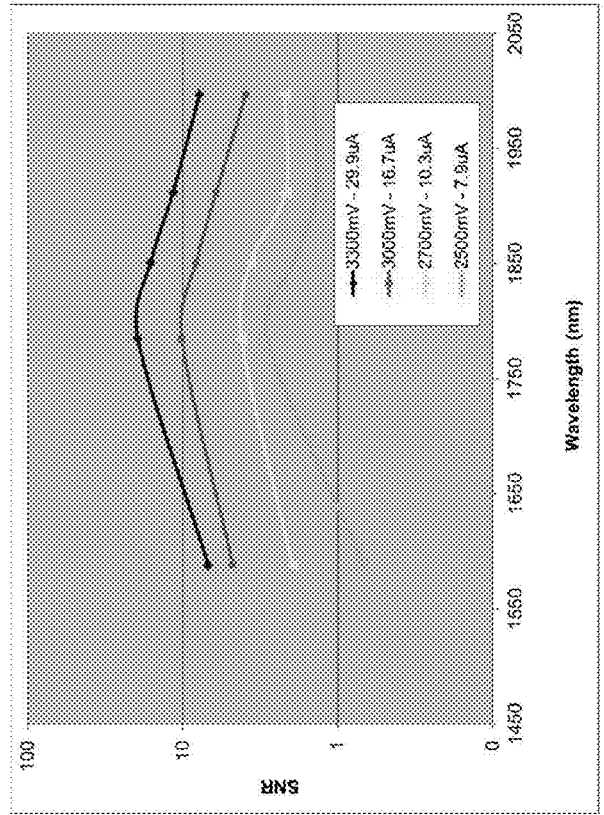
FIG. 5 illustrates a flow chart of a method according to one embodiment.

Described herein are aspects of a camera which adaptively selects an optimal wavelength for observation of a VLSI device, by inserting an appropriate short pass filter in the optical path. The wavelength is optimized according to criteria such as maximizing the SNR, or a combination of high SNR and high resolution (which biases the optimization towards shorter wavelengths), so as to obtain the best emission image for a given device under test (DUT).

While previous art already describes the introduction of a wide-band filter in the optical path, it does not do so in an adaptive manner and with consideration to maximizing SNR. Since the optical signal from the VLSI device is very faint, such filters traditionally have a wide bandwidth, in order to allow more light in, and thus shorten the required exposure times.

Conversely, disclosed embodiments use a shortpass filter, since even though the total amount of light passing the filter is smaller, the high SNR still gives shorter exposure times as it matches the specific emission wavelength of the DUT and the applied voltage. In some embodiments, the system first needs to characterize the SNR across the possible observation spectrum.

Since the HC photon emissions depend both on inherent characteristics of the DUT and on operating parameters such as voltage and temperatures, the optimal filter selection can vary from device to device, and so it may not be practical to pre-determine it.

Described herein are aspects of a microscope which adaptively selects an optimal bandwidth for observation of a VLSI device, by inserting an appropriate filter in the optical path. The method includes steps to determine the best shortpass filter so as to obtain the best emission image from each specific DUT at each specific applied voltage, e.g., Vdd.

Aspects of the invention incorporate a method for emission microscopy of a DUT, utilizing an emission microscope having the camera whose embodiment is described in FIG. 2. The camera includes an electronic detector array [21] located within a thermal enclosure [22] and connected to a controller [23]. Also within the thermal enclosure are a cold aperture [24], a filter selector wheel [25] with several short pass filters [25a, 25b . . . ]. The rest of the optical path includes a relay lens [26] and an objective lens [27]. The controller is also connected to the filter selector wheel [25]. A tester [28], e.g., an Automated Testing Equipment (ATE), is used to supply the DUT [29] with a stimulation signal to induce it to operate and change state. The ATE stimulation signal includes a signal at a given voltage Vdd. Different voltages cause the emission to have different wavelengths, so the filter wheel is used to select the best short pass filter according to the emission.

The camera in this embodiment uses an MCT (Mercury Cadmium Telluride, HgCdTe) detector array since it has a favorable (uniform and wide) response across the short and medium IR spectrum, but other types of detectors (e.g. InGaAs, extended InGaAs or InSb) can also be used.

In the aspects of the invention described herein, when operating, the controller operates in one of two modes.

"Characterization" or calibration mode: In this mode the controller uses the tester to create a test signal which creates a robust emission from the DUT. The controller then aggregates multiple measurements from the detector array (enough to form a statistical base measurement), comparing the times when the DUT is both active and inactive, to find the noise floor level of the system. In finding this level, the controller can aggregate and compare measurements from multiple pixels. The controller repeats this process while using different short pass filters, and so can tabulate the SNR for each filter and select the optimal filter.

"Observation" or test mode: In this mode the controller switches to the optimal filter, and uses the tester to run the real-life test vectors to observe the DUT.

In some embodiments, the objective lens [27] has a flat front surface and its index of refraction matches that of the substrate of the DUT, so that it can be used in contact with the DUT, increasing the numerical aperture of the camera. A lens like this is called a solid immersion lens (SIL), and it can operate together with a standard collection objective lens.

In some embodiments, the camera features several interchangeable objective lenses, typically mounted on a rotary turret. One of the objective lenses can be a Macro lens, which by its nature is larger in diameter and requires a larger relay lens. In such a situation, it becomes advantageous to not use the relay lens configuration while using the macro lens, and so install the relay lens on a mount that allows it to be removed from the optical path.

FIG. 3 depicts an embodiment of this invention. The detector [32] and short pass filter selector [30] are unchanged from the previous embodiment. A turret [34] carries multiple objective lenses [34a, 34b, 34c]. One of the lenses [34a] is a macro lens and is larger than the other lenses which are micro lenses. The relay lens [33] is mounted on a pivot or slide which allows it to be moved to a position [33a] outside the optical path, which is done when the macro lens [34a] is in use. An aperture wheel [31] contains several cold apertures [31a] of different sizes, each matching one of the objective lenses. The optical axis [35] is indicated by the horizontal dashed line.

The DUT 39 is mounted onto a bench 36. The bench 36 may include temperature control mechanism to maintain the DUT at constant temperature during testing. Such mechanism may include, for example, thermo-electric cooler (TEC), spray cooler, etc. The DUT received test signals (vectors), including voltage Vdd, from a tester 38 (e.g., ATE). Tester ATE may be a standard testing equipment and is not part of the emission detection system. Controller 37 is configured to control the operation of the emission tester. Controller 37 may be programmed to operate the short pass filter selector 30 and the collection of emission signal from the optical detector 32.

Figure 4:
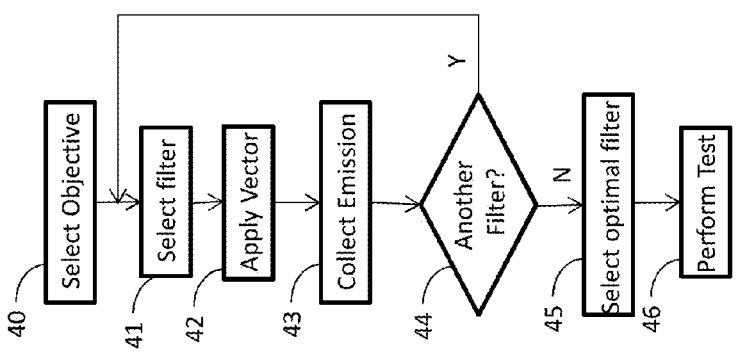
FIG. 4 illustrates a flow chart of a process according to one embodiment.

FIG. 4 illustrates a flow chart of a process according to one embodiment. In step 40, an objective lens is selected from the available objective lenses. In one embodiment, this step includes the landing of a SIL on the DUT to collect emission form the area of interest. Also, in some embodiments this step includes the selection of corresponding cold filter. In step 41 a first filter, among a plurality of short pass filters, is selected. In one embodiment, each short pass filter has a cut-off frequency at different wavelength, enabling coverage in the wavelengths from about 1200 nm to about 2200 nm. Each short pass filter has an upper cut-off wavelength that practically eliminates any transmission above its cut off, thus avoiding noise above the selected cut off frequency. In an alternative embodiment, the short pass filters may be replaced by narrow-band filters, wherein each narrow-band filter has a bandwidth of about 100 nm, and the available filters are distributed to cover frequencies in the wavelengths from about 1200 nm to about 2200 nm. However, shortpass filters enable more signal to pass than bandpass filters, so it is preferable to use short pass filters. Also, since the thermal background emission and its associated noise are both increasing with wavelength, using short pass filters instead of bandpass filters efficiently cuts off these deleterious effects, while enabling higher signal levels to pass at wavelengths lower than the cut off.

Figure 6:
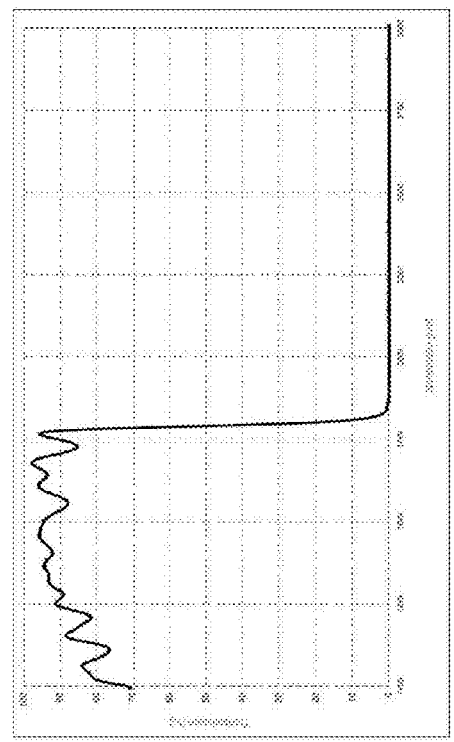
FIG. 6 is a plot showing transmission of an SP1800 shortpass filter.

According to one embodiment, four short pass filters are used. In one example the short pass filters used are SP1550 (which is used to mimic an InGaAs camera—i.e., cuts off longer wavelengths that a standard InGaAs sensor cannot detect, but any of the other detectors, such as HgCdTe or extended InGaAs can detect), SP1800, SP1900, and SP2000. Each short pass filter transmits everything below the specified cut off, but blocks transmission above the specified cut off. For example, SP1800 transmits everything below, but blocks everything above 1800 nm, as shown in FIG. 6. Since the detector itself only absorbs light above 900 nm, the system is effectively capturing light from 900 nm to 1800 nm in the example of SP1800.

In step 42, a test vector is applied to the DUT, while holding all parameters constant. Importantly, the temperature of the DUT and the voltage Vdd should be held constant, while at step 43 emission signal is collected and stored. Then, in step 44 it is determined whether there are more filters to test and, if so, the process reverts to step 41 wherein the next filter is selected. Then, the same test vectors are applied to the DUT and, while keeping all parameters constant, another set of emission signal is collected and stored. When at step 44 it is determined that all filters have been tested, the process proceeds to step 45 to determine the best filter to use for the actual emission testing of the DUT. According to one embodiment, in this step the detected emission and noise are quantified against each of the filters used. In one specific embodiment this is done by plotting signal to noise ratio against wavelength. An example of such a plot is depicted in FIG. 5. In the example of FIG. 5, the test outlined above was repeated for all available filters and for different Vdd (each series of test having Vdd held constant). Then, for the actual emission test, it is determined what filter to use according to the best SNR and the voltage Vdd that is going to be used in the emission test. In the example of FIG. 5, it is shown that a lower Vdd results in shorter wavelength emission, so that a shorter wavelength filter may be used for the lower Vdd, while a longer wavelength filter may be used for the higher Vdd. On the other hand, other testing with different devices have shown that such behavior is not typical, and when testing devices which operate at the mV range, i.e., below 1 volt, the behavior is reversed, i.e., lower Vdd produces emission and longer wavelengths, thus requiring a longer wavelength filter for best SNR. Therefore, this test should be performed for each new device tested. The standard emission test is then performed at step 46 using the appropriately selected shortpass filter.

The present invention has been described in relation to particular examples, which are intended in all respects to be illustrative rather than restrictive. Those skilled in the art will appreciate that many different combinations of hardware, software, and firmware will be suitable for practicing the present invention. Moreover, other implementations of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A system, comprising:
   a detector sensitive to electromagnetic radiation having wavelengths of at least from 1000 nm to 2200 nm;
   a plurality of shortpass optical filters;
   a selector for selectively placing one of said shortpass optical filters in an optical path that couples a semiconductor device under test (DUT) to the detector; and,
   a controller connected to said detector and to said selector, the controller configured to selectively operate in a calibration mode and in a test mode, and wherein:
   during calibration mode, the controller operates the selector to successively insert each of said shortpass optical filters within said optical path as the controller records emission signals received by the detector from the DUT, and compares the signal-to-noise ratios of the recorded emission signals; and,
   during test mode, the controller operates said selector to insert the shortpass optical filter associated with the highest signal-to-noise ratio of the plurality of shortpass optical filters for a selected test voltage of a plurality of test voltages into the optical path while the controller records emission signals received by the detector from the DUT.

2. The system of claim 1, wherein the controller is further configured to generate a plot of signal-to-noise ratio versus wavelength.

3. The system of claim 2, wherein the controller is further configured to generate a plot of signal-to-noise ratio versus wavelength for each of the test voltages.

4. The system of claim 1, wherein said plurality of shortpass filters comprises shortpass filters having cutoffs at 1550 nm, 1800 nm, 1900 nm, and 2000 nm.

5. The system of claim 1, wherein said shortpass filters provide spectrum coverage of wavelengths from 900 nm to 2200 nm.

6. The system of claim 1, further comprising a solid immersion lens situated on the optical path adjacent the DUT so as to direct emission signals from the DUT to the detector.

7. The system of claim 6, further comprising a collection objective lens and a relay lens situated to direct emission from the DUT to the detector.

8. The system of claim 7, wherein the relay lens is configured to be selectively insertable into and removable from the optical path.

9. The system of claim 7, further comprising a plurality of cold apertures configured to be selectively insertable into the optical path.

10. The system of claim 1, further comprising a temperature control mechanism that maintains the DUT at a constant temperature during the calibration mode.

11. The system of claim 9, further comprising a thermal enclosure housing the cold aperture, the plurality of shortpass optical filters and the detector.

12. The system of claim 1, further comprising a plurality of cold apertures insertable into the optical path.

13. The system of claim 1, further comprising a plurality of objective lenses and a plurality of cold apertures, each cold aperture matching one of the plurality of lenses.

14. The system of claim 13, wherein the plurality of objective lenses includes at least one macro lens and one micro lens.

15. The system of claim 1, wherein the selector is configured for selectively placing one of said shortpass optical filters with a corresponding cold aperture in said optical path.

* * * * *